United States Patent
Park et al.

(10) Patent No.: US 10,815,565 B2
(45) Date of Patent: Oct. 27, 2020

(54) METHOD FOR SYNTHESIZING A GRAPHENE PATTERN

(71) Applicant: KOREA INSTITUTE OF SCIENCE AND TECHNOLOGY, Seoul (KR)

(72) Inventors: Jaehyun Park, Seoul (KR); Yumin Sim, Seoul (KR); Jaikyeong Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 35 days.

(21) Appl. No.: 16/198,663

(22) Filed: Nov. 21, 2018

(65) Prior Publication Data
US 2020/0149152 A1    May 14, 2020

(30) Foreign Application Priority Data

Nov. 12, 2018 (KR) .................. 10-2018-0138211

(51) Int. Cl.
*C23C 16/26* (2006.01)
*C23C 16/02* (2006.01)
(Continued)

(52) U.S. Cl.
CPC ...... *C23C 16/0272* (2013.01); *C23C 16/0227* (2013.01); *C23C 16/26* (2013.01); *G02F 1/0018* (2013.01); *G02F 1/011* (2013.01)

(58) Field of Classification Search
CPC . C23C 16/26; C23C 16/0272; C23C 16/0227; G02F 1/0018; G02F 1/011
See application file for complete search history.

(56) References Cited

U.S. PATENT DOCUMENTS

| 8,410,474 | B2 | 4/2013 | Okai et al. |
| 9,206,509 | B2 * | 12/2015 | Baraton ............. C23C 16/0281 |

(Continued)

FOREIGN PATENT DOCUMENTS

| KR | 10-2014-0092262 A | 7/2014 |
| KR | 10-2014-0093939 A | 7/2014 |

(Continued)

OTHER PUBLICATIONS

Wu, Yixuan, et al., "Patterning Graphene Film by Magnetic-assisted UV Ozonation". Scientific Reports, 7:46583, Apr. 2017, pp. 1-9. DOI: 10.1038/srep46583.*

(Continued)

*Primary Examiner* — Bret P Chen
(74) *Attorney, Agent, or Firm* — Rabin & Berdo, P.C.

(57) ABSTRACT

A method for synthesizing a graphene pattern includes physically adhering a catalyst block including a catalyst material, which is a gamma-alumina thin film, to a portion of a growth substrate to form a flat interface between the catalyst block and the growth substrate; forming a graphene thin film selectively at the flat interface between the catalyst block and the growth substrate in an atmosphere including a carbon source and a growth inhibitor containing oxygen, and applying a force to physically separate the catalyst block from the graphene thin film and the growth substrate, wherein carbon atoms from the carbon source are diffused along the flat interface and the growth inhibitor is substantially blocked by a diffusion barrier formed by the flat interface so that the graphene thin film is selectively formed at the flat interface.

13 Claims, 10 Drawing Sheets

(51) Int. Cl.
*G02F 1/01* (2006.01)
*G02F 1/00* (2006.01)

(56) References Cited

U.S. PATENT DOCUMENTS

| | | | |
|---|---|---|---|
| 9,567,223 | B2 | 2/2017 | Song et al. |
| 10,629,696 | B1* | 4/2020 | Park .................. H01L 21/02112 |
| 2008/0264475 | A1* | 10/2008 | Ito .......................... B82Y 10/00 |
| | | | 136/252 |
| 2012/0321545 | A1* | 12/2012 | Jeon ...................... C01B 32/225 |
| | | | 423/448 |
| 2013/0315816 | A1* | 11/2013 | Watson ................... C01B 32/17 |
| | | | 423/448 |
| 2013/0341792 | A1* | 12/2013 | Noda ................ H01L 29/66742 |
| | | | 257/741 |
| 2014/0234200 | A1* | 8/2014 | Tour ...................... C01B 32/194 |
| | | | 423/448 |
| 2014/0255500 | A1* | 9/2014 | Son ........................ B01J 23/755 |
| | | | 424/490 |
| 2015/0299852 | A1* | 10/2015 | Ozkan ................... B82Y 10/00 |
| | | | 136/255 |

FOREIGN PATENT DOCUMENTS

| | | |
|---|---|---|
| KR | 10-2015-0038579 A | 4/2015 |
| KR | 10-1513136 B1 | 4/2015 |

OTHER PUBLICATIONS

Zhou, Yong, et al., "Making Patterns on Graphene". Advanced Materials, 2010, 22, 3615-3620.*
Bobadilla, Alfredo D., et al., "PMMA-Assisted Plasma Patterning of Graphene". Journal of Nanotechnology, vol. 2018, Article ID 8349626, pp. 1-8. https://doi.org/10.1155/2018/8349626.*
Feng, Ji, et al., "Patterning of graphene". Nanoscale, 2012, 4, pp. 4883-4899.*
Yufeng Hao et al., "Oxygen-activated growth and bandgap tunability of large single-crystal bilayer graphene", Nature Nanotechnology, Published Online, Feb. 1, 2016, pp. 1-6.
Lili Fan et al., "Topology evolution of graphene in chemical vapor deposition, a combined theoretical/experimental approach toward shape control of graphene domains", Nanotechnology, 2012, 115605, vol. 23.
Yuan Meng et al., "Waveguide Engineering of Graphene Optoelectronics-Modulators and Polarizers", IEEE Photonics Journal, Feb. 2018, vol. 10, No. 1.

* cited by examiner

METHOD FOR SYNTHESIZING A GRAPHENE PATTERN

CROSS-REFERENCE TO RELATED APPLICATIONS

This application claims priority under 35 U.S.C. § 119 to Korean Patent Application No. 10-2018-0138211, filed on Nov. 12, 2018, and all the benefits accruing therefrom, the content of which is herein incorporated by reference in its entirety.

BACKGROUND

1. Field

Exemplary embodiments relate to a method for synthesizing a graphene pattern. More particularly, exemplary embodiments relate to a method for synthesizing a graphene pattern and a method for manufacturing an electro-optical modulator.

2. Description of the Related Art

Graphene is a two-dimensional material having a high carrier mobility and an optical anisotropy, and can be used for an electronic device, an electro-optical device or the like. Thus, research and development for graphene are being actively conducted.

One of important technical solutions for implementing intrinsic performance of graphene is forming a graphene thin film having a high quality. Furthermore, in order to use graphene for an optical device such as an electro-optical device, defects in graphene needs to be extremely inhibited or precisely controlled. However, a conventional method for patterning graphene includes an etching process or a transferring process. Thus, graphene may be easily contaminated, and manufacturing efficiency is low.

SUMMARY

Exemplary embodiments provide a method for directly synthesizing a graphene pattern.

Exemplary embodiments provide a method for manufacturing an electro-optical modulator using direct synthesis of a graphene pattern.

According to an exemplary embodiment, a method for synthesizing a graphene pattern is provided. According to the method, a catalyst block including a catalyst material is physically adhered to a portion of a growth substrate to form an interface between the catalyst block and the growth substrate. A graphene thin film is formed selectively at the interface between the catalyst block and the growth substrate in an atmosphere including a carbon source and a growth inhibitor.

In an exemplary embodiment, the catalyst material includes gamma-alumina.

In an exemplary embodiment, when the catalyst block is physically adhered to the growth substrate, at least one of the catalyst block and the growth substrate is chemically cleaned by using Piranha solution, at least one of the catalyst block and the growth substrate is physically cleaned by using supersonic wave, at least one of the catalyst block and the growth substrate is dried, and the catalyst block is brought into contact with the growth substrate.

In an exemplary embodiment, the growth inhibitor contains oxygen.

In an exemplary embodiment, a concentration of the growth inhibitor to the carbon source is equal to or more than $1/10^6$.

In an exemplary embodiment, the catalyst block includes a first body and a second body. The first body has a shape protruding from the second body. The catalyst block is physically adhered to the growth substrate in a first region to form the interface, and spaced apart from the growth substrate in a second region, and spaced apart from the growth substrate by a distance in a third region smaller than in the second region.

In an exemplary embodiment, the distance between the catalyst block and the growth substrate in the third region is 5 nm to 1 mm.

In an exemplary embodiment, the graphene thin film is selectively synthesized in the first region and the third region, the graphene thin film has a higher conductivity in the first region than the third region.

In an exemplary embodiment, the third region is disposed between adjacent first regions, and the graphene thin film in the third region forms a percolation channel connecting the first regions to each other and having an effective channel width equal to or less than 5 nm.

In an exemplary embodiment, the second body includes a via portion connected to the second region.

According to an exemplary embodiment, a method for manufacturing an electro-optical modulator is provided. According to the method, a passivation layer is formed on a base substrate including a waveguide. A first catalyst block including a catalyst material is physically adhered to a portion of the passivation layer to form an interface between the first catalyst block and the passivation layer. A first graphene thin film is formed selectively at the interface between the first catalyst block and the passivation layer in an atmosphere including a carbon source and a growth inhibitor. The first catalyst block is separated from the first graphene thin film. A masking block is physically adhered to a portion of the first graphene thin film to form an interface between the masking block and the first graphene thin film. A dielectric layer is formed on an upper surface of the first graphene thin film uncovered by the masking block. A second catalyst block including a catalyst material is physically adhered to a portion of the dielectric to form an interface between the second catalyst block and the dielectric layer. A second graphene thin film is formed selectively at the interface between the second catalyst block and the dielectric layer in an atmosphere including a carbon source and a growth inhibitor.

According to the exemplary embodiments, a graphene thin film may be formed selectively at an interface between a catalyst block and a growth substrate. Thus, a graphene pattern may be directly obtained without an individual patterning process.

Furthermore, diffusion of a defect-forming factor is inhibited in a region where the graphene thin film thereby increasing a quality of the graphene thin film.

BRIEF DESCRIPTION OF THE DRAWINGS

The above and other features and advantages will become more apparent by describing exemplary embodiments thereof with reference to the accompanying drawings, in which.

DETAILED DESCRIPTION

Figure 1A:
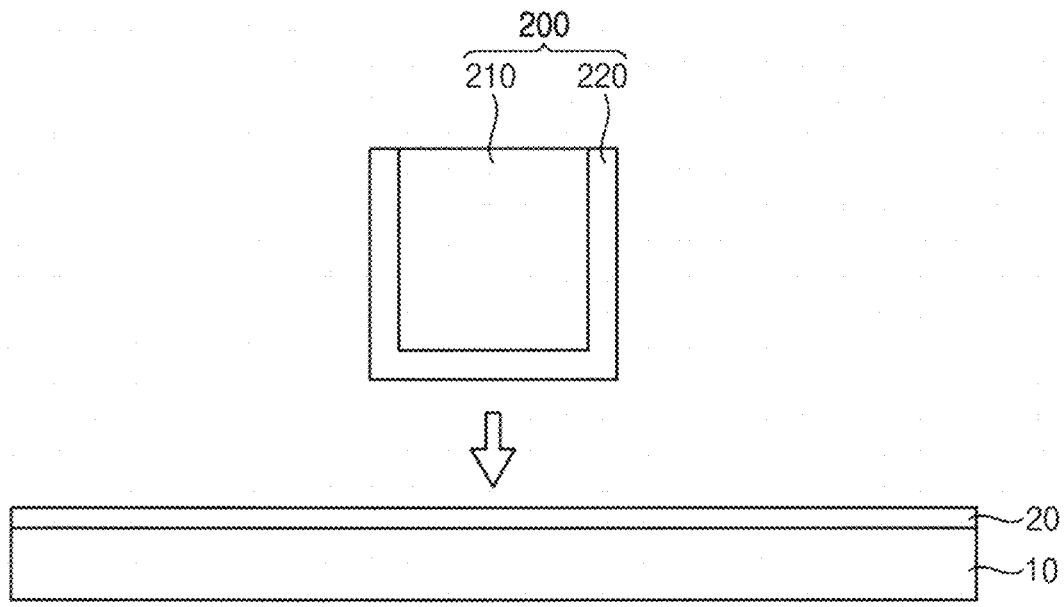
FIGS. 1A to 1D are cross-sectional views illustrating a method for synthesizing a graphene pattern according to an exemplary embodiment.

Example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity. It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Method for Synthesizing a Graphene Pattern.

FIGS. 1A to 1D are cross-sectional views illustrating a method for synthesizing a graphene pattern according to an exemplary embodiment.

Figure 1B:
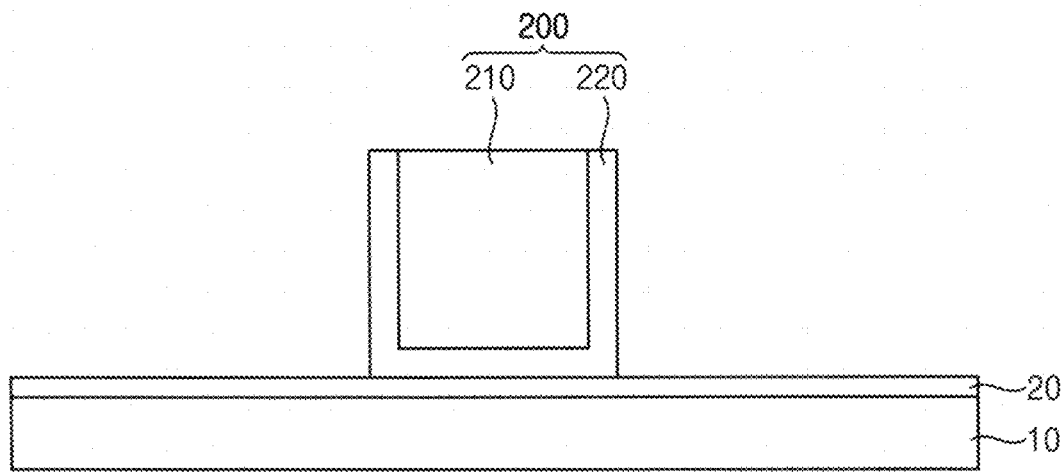

Referring to FIGS. 1A and 1B, a catalyst block 200 is physically adhered to a growth substrate. Hereinafter, an interface region formed by adhesion of the growth substrate and the catalyst block 200 may be referred as a first region, and an exposed region, where the growth substrate is spaced apart from the catalyst block 200 thereby not forming a graphene thin film, may be referred as a second region. Hereinafter, "physical adhesion" may mean "adhesion without forming chemical bonds".

In an exemplary embodiment, the growth substrate may include a base substrate 10 and a passivation layer 20 disposed on an upper surface of the base substrate 10. The catalyst block 200 may be physically adhered to the passivation layer 20.

For example, the base substrate 10 may include silicon, silicon oxide, metals, metal oxides or a combination thereof.

In an exemplary embodiment, the passivation layer 20 may include hexagonal boron nitride (h-BN). Hexagonal boron nitride does not has a dangling bond at a surface thereof, and has a small lattice mismatch to graphene. Thus, when graphene is formed on a surface of h-BN, adsorptive doping may be prevented, and defects in graphene may be inhibited.

In an exemplary embodiment, the passivation layer 20 may include hexagonal boron nitride carbide (h-BNC) wherein nitrogen atoms are partially replaced by carbon atoms.

The catalyst block 200 may include a material having a catalyst activity for synthesis of graphene. Thus, the catalyst block 200 may activate dehydrogenation of a carbon source such as hydrocarbons thereby providing carbon atoms for synthesis of graphene.

In an exemplary embodiment, the catalyst block 200 may include a body 210 and a catalyst layer 220 covering a surface of the body 210. The catalyst layer 220 may cover at least a lower surface, and may contact an upper surface of the growth substrate. For example, the body 210 may include silicon, silicon oxide, metals, metal oxides or a combination thereof.

In an exemplary embodiment, the catalyst layer 220 may be a thin film including gamma-alumina.

Gamma-alumina may have a single-crystalline phase or a poly-crystalline phase. Gamma-alumina has a defect spinel structure at a surface thereof. The defect spinel structure of gamma-alumina includes an aluminum tri-coordination ($Al_{III}$) site. The aluminum tri-coordination site is not stable. Thus, when a carbon source such as methane is adsorbed on a surface of gamma-alumina, the aluminum tri-coordination site reduces an activation barrier for dehydrogenation thereby functioning as a catalyst.

Furthermore, gamma-alumina has a small lattice mismatch to graphene. Thus, defects caused by a lattice mismatch or strain therefrom may be effectively inhibited. Furthermore, a surface of gamma-alumina has a fine 3-dimensional convexo-concave structure. Such convexo-concave structure may reduce strain due to lattice mismatch. Thus, a graphene thin film having a high quality with inhibited defects may be synthesized at an interface of gamma-alumina, especially at an interface between gamma-alumina and h-BN.

In an exemplary embodiment, the gamma-alumina thin film may be formed by a deposition method. For example, the gamma-alumina thin film may be formed by chemical vaporization deposition (CVD) including atomic layer deposition (ALD), molecular beam epitaxy (MBE) growth.

For example, an amorphous alumina thin film may be formed by ALD, and the amorphous alumina thin film may be changed to a gamma-alumina thin film through a heat treatment.

For example, an aluminum precursor and an oxygen precursor may be provided in an ALD process to form the amorphous alumina thin film. For example, the aluminum precursor may include trimethyl aluminium (($CH_3$)$_3$Al, TMA), aluminum isoproxide, ([Al($OC_3H_7$)$_3$], IPA), methyl-pyrolidine-tri-methyl aluminum (MPTMA), ethyl-pyridin-etriethyl-aluminum (EPPTEA) ethyl-pyridine-dimethyl-aluminumhydridge, EPPDMAH, $AlCH_3$ or a combination thereof.

For example, a crystallization process using a heat treatment may be performed at 100° C. to 1,450° C. for 1 to 30 minutes.

The crystallization process using a heat treatment may be omitted. For example, a deposition temperature in a CVD process and an ALD process may be controlled, or an MBE growth may be performed to form a gamma-alumina thin film without an individual heat treatment process.

The catalyst block 200 is physically adhered to an upper surface of the growth substrate to form an interfacial diffusion barrier to a growth inhibitor between the catalyst block 200 and the growth substrate.

In order to physically adhere the catalyst block 200 to the growth substrate, a contact surface of the catalyst block 200 may be cleaned.

For example, cleaning the contact surface of the catalyst block 200 may include steps of chemical cleaning, physical cleaning and drying.

In an exemplary embodiment, Piranha solution may be used for the chemical cleaning. The Piranha solution may be obtained by mixing sulfuric acid with hydrogen peroxide. For example, the contact surface of the catalyst block 200 may be dipped in the Piranha solution for the chemical cleaning.

In an exemplary embodiment, supersonic wave and water may be used for the physical cleaning. For example, a process such as Megasonic cleaning may be used for generating an acoustic field thereby removing particles on the contact surface of the catalyst block 200.

In an exemplary embodiment, nitrogen gas or the like may be provided for drying.

Furthermore, a contact surface of the growth substrate may be cleaned by same processes as the above.

After the cleaning process, the catalyst block 200 and the passivation layer 20 of the growth substrate are disposed to contact each other such that the contact surface of the catalyst block 200 is parallel with an upper surface of the passivation layer 20. Accordingly, the catalyst block 200 is physically adhered to the passivation layer 20 thereby forming the interfacial diffusion barrier to the growth inhibitor between the catalyst block 200 and the growth substrate.

Figure 1C:
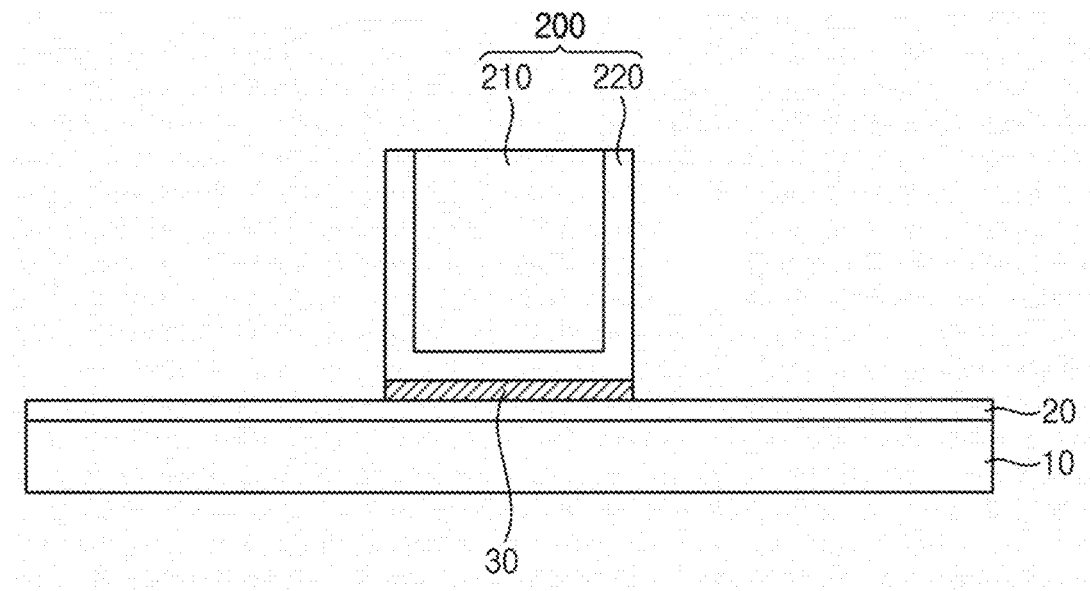

Referring to FIG. 1C, a graphene thin film 30 is synthesized at an interface of the catalyst block 200 and the growth substrate. In an exemplary embodiment, the graphene thin film 30 is formed at an interface between h-BN and gamma-alumina.

For example, the growth substrate combined with the catalyst block 200 is disposed in a chamber. Thereafter, a CVD process may be performed for synthesizing graphene. A hydrocarbon such as methane, ethane or the like may be provided as a carbon source for synthesizing graphene. In an exemplary embodiment, a methane gas may be used for the carbon source.

The carbon source may be dehydrogenated on an exposed surface of the catalyst layer 200 by catalyst activation thereby generating source atoms such as carbon atoms. The carbon atoms generated from the carbon source may be diffused at the interface between the catalyst block 200 and the growth substrate. Thus, graphene may be synthesized between the catalyst block 200 and the growth substrate.

For example, the graphene thin film 30 may be formed at 150° C. to 1,200° C. In an exemplary embodiment, the graphene thin film 30 may be synthesized at a relatively low temperature by catalyst activation of the catalyst block 200. Preferably, the graphene thin film 30 may be synthesized at a lower temperature compared with other methods for synthesizing graphene, for example, at 150° C. to 800° C.

In an exemplary embodiment, synthesis of the graphene thin film 30 may be performed under a process condition including a carbon source and a growth inhibitor. Thus, atmosphere in which the graphene thin film 30 is synthesized may include at least the carbon source and the growth inhibitor. The growth inhibitor may include an oxygen-containing material such as an oxygen gas, hydrogen oxide or the like.

Accordingly, graphene is not synthesized in an area where the growth substrate is exposed, because combustion reaction of the carbon atoms with the growth inhibitor or oxygen atoms from the growth inhibitor is predominant to graphitization reaction. Thus, the graphene thin film 30 is selectively formed between the catalyst block 200 and the growth substrate to form a graphene pattern.

For example, a concentration of the growth inhibitor, which is a volume ratio to the carbon source, may be equal to or more than $1/10^6$ so that combustion reaction may be predominant at an area excluding the interface. The concentration of the growth inhibitor, which satisfies the condition, may be varied depending on a process temperature. For example, the concentration of the growth inhibitor to the carbon source may be equal to or more than $1/10^5$ at 800° C. to 1,200° C. In an exemplary embodiment, the concentration of the growth inhibitor to the carbon source may be equal to or more than $1/10^4$ to further promote the combustion reaction at an area excluding the interface. The concentration of the growth inhibitor may be a concentration of molecules, and a concentration of oxygen atoms generated from the growth inhibitor to the carbon atoms from the carbon source may be different from the concentration of molecules. For example, the concentration of the oxygen atoms to the carbon atoms may be equal to or more than $1/10^3$, may be preferably equal to or more than $1/10^2$.

A thickness of the graphene thin film 30 may be controlled. For example, the graphene thin film 30 may have a thickness of a monolayer or a bi-layer as well as a thickness equal to or more than a triple-layer. For example, a thickness of the graphene thin film 30 may be at least 0.33 nm, and may be increased depending on a process condition.

The graphene thin film 30 may have extremely inhibited defects thereby having a high quality.

In the CVD process, impurities causing defects of graphene may enter a process chamber. When the graphene thin film 30 is formed at the interface between the catalyst block 200 and the growth substrate as an exemplary embodiment, affection of impurities in the process chamber may be minimized. Atoms or molecules are diffused according to interfacial diffusion between the catalyst block 200 and the growth substrate. Diffusivity of the atoms or the molecules according to interfacial diffusion may be varied drastically depending kinds of the atoms and the molecules. For example, diffusivity according to interfacial diffusion may be calculated as the following:

$$D \approx v_0 \exp\left(\frac{-E_d}{k_B T}\right)$$

$v_0$: n-th order vibrational frequency, (mostly $10^{13}$/s)
$E_d$: interfacial diffusion barrier
$k_B$: Boltzmann constant ($8.62 \times 10^{-5}$ eV/K)
T: absolute temperature (K)

According to the above, a ratio of diffusivities of carbon atoms and oxygen molecules is at least 20,000. Thus, affection of impurities such as oxygen molecules may be minimized in the process of synthesizing graphene. Therefore, graphene having inhibited defects may be obtained.

Figure 1D:
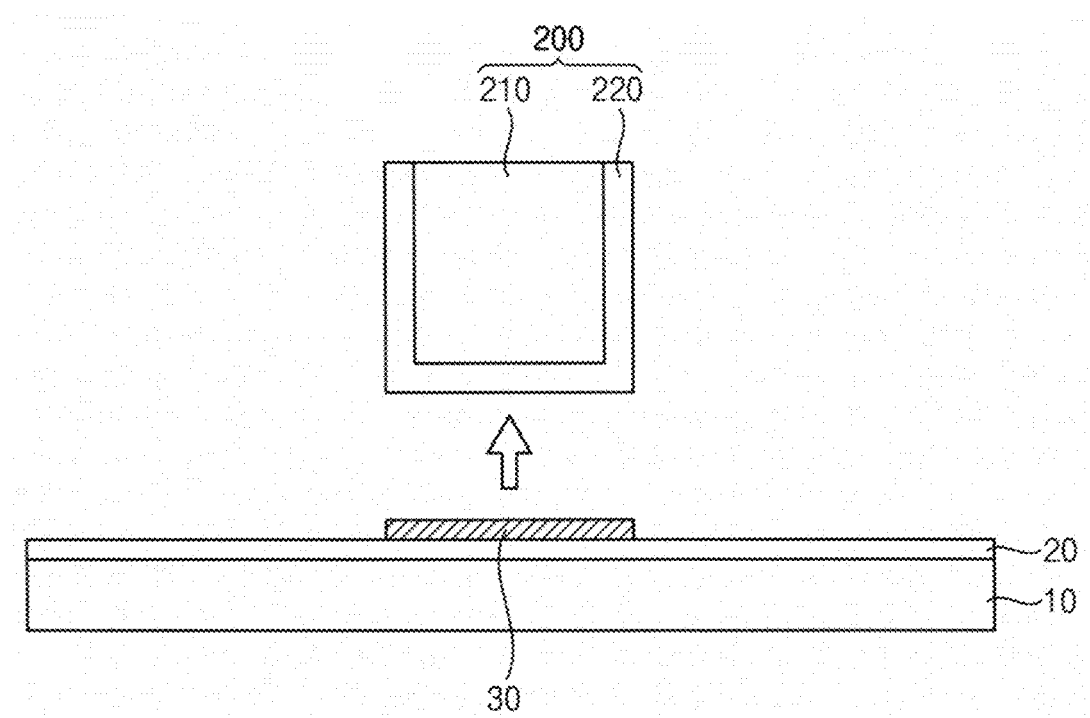

Referring to FIG. 1D, the catalyst block 200 is separated from the growth substrate on which the graphene thin film 30 is formed.

When the catalyst layer 220 of the catalyst block 200 includes gamma-alumina, and when the passivation layer 20 includes h-BN, an adhesion energy between the graphene thin film 30 and the passivation layer 20 is more than an adhesion energy between the graphene thin film 30 and the catalyst layer 220. Thus, when an external force is applied to the catalyst block 200, the catalyst block 200 may be removed from the graphene thin film 30, and the graphene thin film 30 may remain on the growth substrate. After separated from the growth substrate, the catalyst block 200 may be reused.

FIGS. 1A to 1D show the growth substrate having a plate shape and the catalyst block having a smaller size than the growth substrate. However, the growth substrate and the catalyst block are intended to be distinguished in view of function in the present inventive concept, and exemplary embodiments are not limited thereto. For example, a growth substrate may include a protrusion, and a catalyst block having a plate shape larger size than the protrusion may be adhered to an upper surface of the protrusion, in another exemplary embodiment.

Figure 2A:
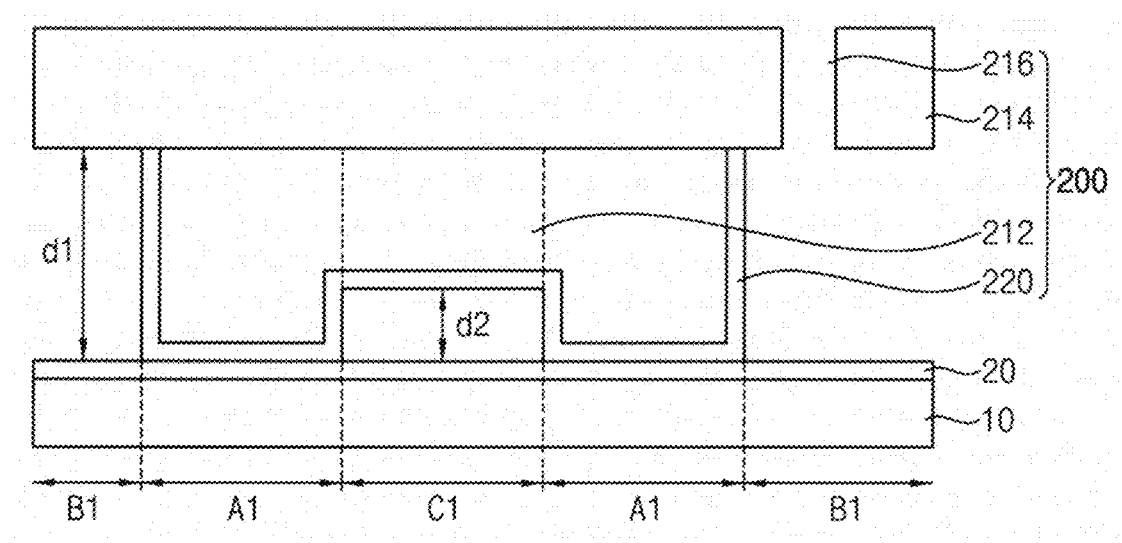
FIGS. 2A and 2B are cross-sectional views illustrating a method of synthesizing a graphene pattern according to an exemplary embodiment.
Figure 2B:
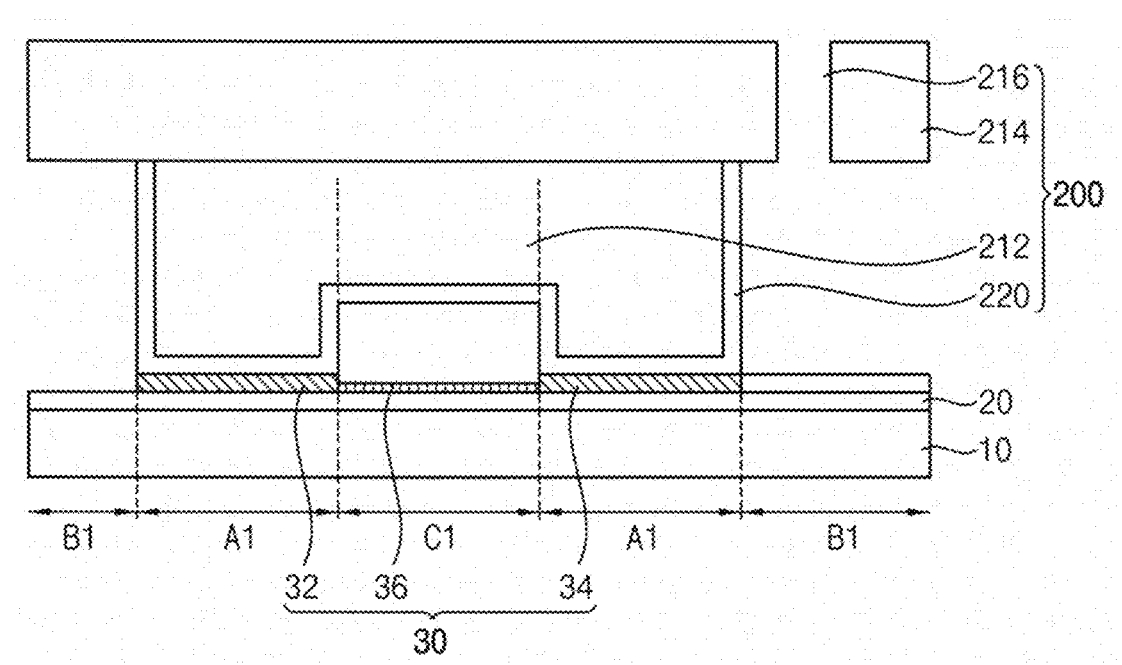
Figure 3A:
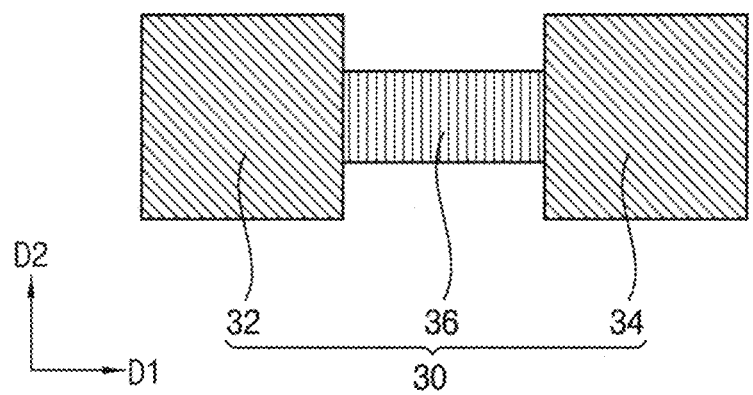
FIGS. 3A and 3B are plan views of a graphene pattern synthesized according to an exemplary embodiment.
Figure 3B:
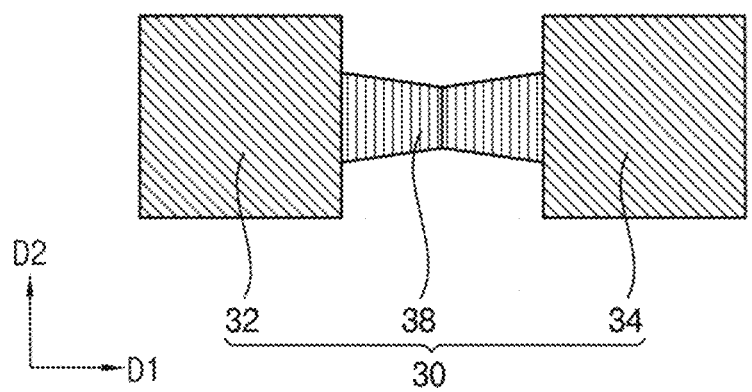

FIGS. 2A and 2B are cross-sectional views illustrating a method of synthesizing a graphene pattern according to an exemplary embodiment. FIGS. 3A and 3B are plan views of a graphene pattern synthesized according to an exemplary embodiment.

Referring to FIGS. 2A and 2B, a catalyst block 200 is physically adhered to a growth substrate.

In an exemplary embodiment, the growth substrate may include a base substrate 10 and a passivation layer 20 disposed on an upper surface of the base substrate 10. The catalyst block 200 may be physically adhered to the passivation layer 20.

The catalyst block 200 may include a first body 212, a second body 214 and a catalyst layer 220. The first body 212 may have a shape protruding from the second body 214 toward the growth substrate. The catalyst layer 220 may cover at least a portion of surfaces of the first body 212 and the second body 214.

The catalyst block 200 contacts the growth substrate in a first region A1 to form an interface, and is spaced apart from the growth substrate in a second region B1 and a third region C1. A distance d1 between the catalyst block 200 and the growth substrate in the second region B1 is larger than a distance d2 between the catalyst block 200 and the growth substrate in the third region C1. In a plan view, the third region C1 may have a shape surrounding the first region A1 and the second region B1. The third region C1 may be disposed between first regions A1 adjacent to each other.

A via portion 214 may be formed through the second body 214 in the second region B1.

In an exemplary embodiment, the distance d2 between the catalyst block 200 and the growth substrate in the third region C1 may be designed to satisfy the condition of Knudsen diffusion. For example, the distance d2 between the catalyst block 200 and the growth substrate in the third region C1 may be 5 nm to 1 mm.

Thereafter, a graphene thin film 30 is synthesized in the first region A1 and the third region C1.

For example, a carbon source such as methane may be provided through the via portion 216 formed through the second body 214 of the catalyst block 200. The carbon source may be dehydrogenated by the catalyst layer 220 to generate carbon atoms.

In the first region A1, carbon atoms may be diffused according to interfacial diffusion to synthesize graphene, as explained in the above. In the second region B1, combustion reaction between carbon atoms and a growth inhibitor is predominant so that graphene is not synthesized. In the third region C1, graphene having a conductivity lower than graphene in the first region A1 is synthesized.

In an exemplary embodiment, carbon atoms may be diffused according to Knudsen diffusion in the third region C1. Diffusivity according to Knudsen diffusion may be calculated as the following:

$$D \approx \sqrt{\frac{8 k_B T}{\pi M}}$$

M: molecular weight
$k_B$: Boltzmann constant ($8.62 \times 10^{-5}$ eV/K)
T: absolute temperature (K)

Carbon atoms may be provided to the third region C1 from the first region A1. Furthermore, the third region C1 is not directly connected to the via portion. Thus, an amount of a growth inhibitor provided to the third region C1 is smaller than a growth inhibitor in the second region B1. Thus, graphitization reaction may be predominant than combustion reaction thereby forming graphene. Thus, graphene may be synthesized in the third region C1.

Furthermore, flux of a carbon source is reduced under Knudsen diffusion is reduced. Thus, a synthesis rate of graphene in the first region A1 is different from a synthesis rate of graphene in the third region C1. Thus, a structure and an electrical property of graphene in the first region A1 may be different from a structure and an electrical property of graphene in the third region C1.

In an exemplary embodiment, the graphene thin film 30 may include a first conductive portion 32, a second conductive portion 34 and a channel portion 36, as illustrated in FIG. 3A. The first and second conductive portions 32 and 34 may be formed in the first regions A1 spaced apart from each other. The channel portion 36 may be formed in the third region C1, and may connect the first conductive portion 32 and the second conductive portion 34 to each other. The channel portion 36 may be semiconductive.

For example, the channel portion 36 may form a percolation channel. For example, the channel portion 36 may include a non-conductive area and a conductive area in which graphene grains are formed. The conductive area may consist of graphene grains connected to each other or overlapping each other. The percolation channel may form a channel along a first direction D1. In an exemplary embodiment, an effective channel width of the percolation channel may be equal to or less than 5 nm so that the channel portion 36 may be semiconductive.

FIG. 3A shows the channel portion 36 having a uniform width. However, as illustrated in FIG. 3B, a channel portion 38 may have a relatively larger width in an area adjacent to conductive portions 32 and 34, and may have a relatively smaller width in an area far from the conductive portions 32 and 34.

A process gas may be provided through the via portion 216 of the second body 214 in the second region B1. The process gas may further include a growth inhibitor in addition to the carbon source.

The graphene thin film 30 includes the channel portion connected to the conductive portions and having semiconducting properties. Thus, the graphene thin film 30 may function as a switching element for itself.

In an exemplary embodiment, a graphene thin film may be directly synthesized as a pattern. Furthermore, a channel portion having semiconducting properties may be formed in the graphene thin film. Thus, a graphene switching element may be obtained through a single synthesis process.

FIGS. 4A to 4F are cross-sectional views illustrating a method for manufacturing an electro-optical modulator according to an exemplary embodiment.

Figure 4A:
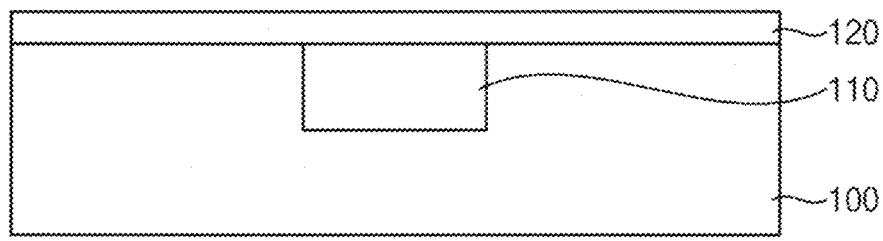
FIGS. 4A to 4F are cross-sectional views illustrating a method for manufacturing an electro-optical modulator according to an exemplary embodiment.

Referring to FIG. 4A, a substrate including a waveguide is prepared. The substrate may include a base substrate 100 having a trench and a waveguide 110 disposed in the trench. The passivation layer 120 may be disposed on an upper surface of the base substrate 100 and on an upper surface of the waveguide 110.

The waveguide 110 may transfer a light. For example, the waveguide 110 may include silicon. The base substrate 110 includes a material having a refractivity different from the waveguide 110. For example, the base substrate 110 may include silicon oxide. In an exemplary embodiment, the waveguide 110 may have a ring shape in a plan view.

In an exemplary embodiment, the passivation layer 120 may include h-BN.

Figure 4B:
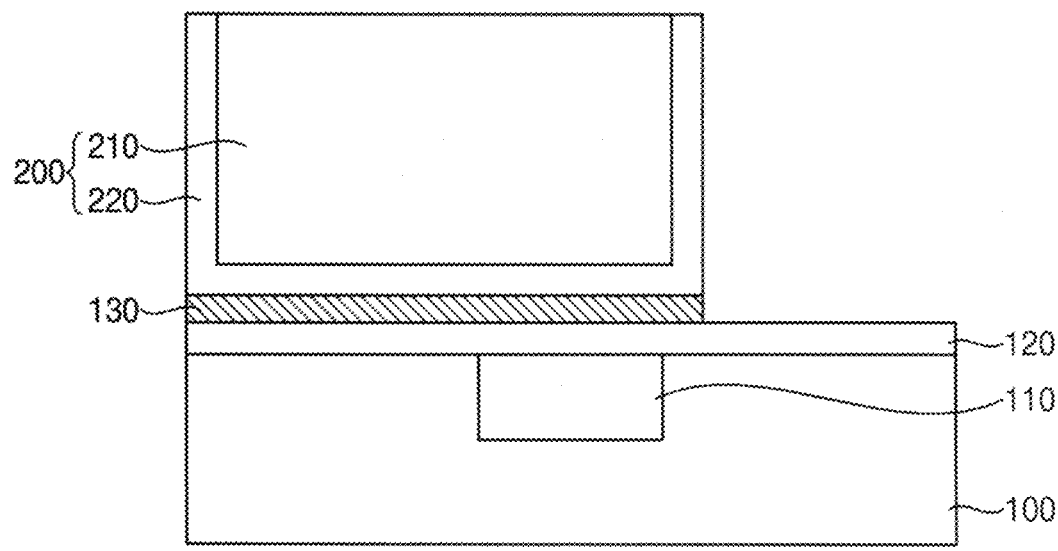

Referring to FIG. 4B, a first catalyst block 200 is physically adhered to an upper surface of the passivation layer 120. The first catalyst block 200 may include a material having catalyst activity for a graphene precursor, for example, gamma-alumina. For example, the first catalyst block 200 may include a body 210 and a catalyst layer 220 covering at least a portion of a surface of the body 210.

In an exemplary embodiment, the first catalyst block 200 may be adhered to the passivation layer 20 to cover a portion of an upper surface of the passivation layer 120, and may overlap the waveguide 110.

Thereafter, a first graphene thin film 130 is synthesized selectively at an interface between the passivation layer 120 and the first catalyst block 200.

Methods for adhering the first catalyst block 200 to the passivation layer 120 and for selectively synthesizing the first graphene thin film 130 are substantially same as the previously explained methods. Thus, any duplicated explanation may be omitted.

Figure 4C:
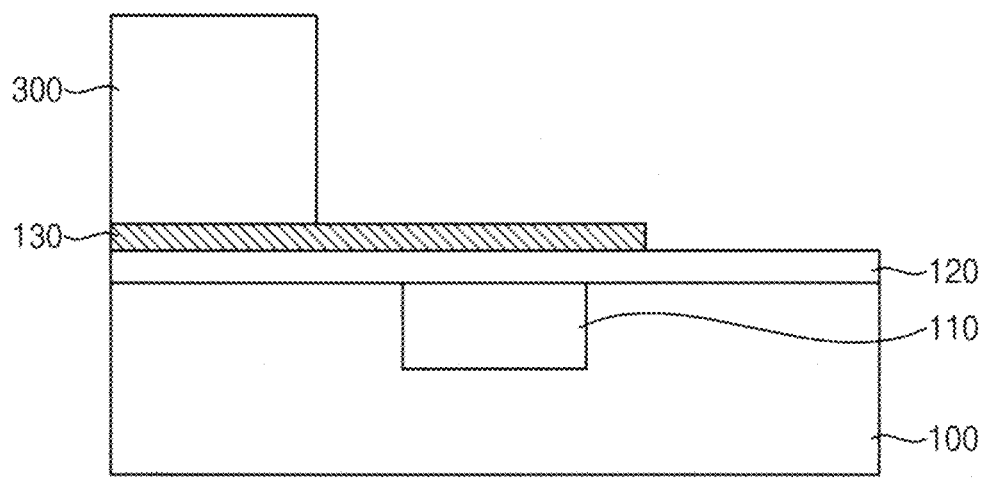

Referring to FIG. 4C, a masking block 300 is physically adhered to an upper surface of the first graphene thin film 130. Thus, the surface of the first graphene thin film 130 may be partially exposed. Hereinafter, a region covered by the masking block 300 may be referred as a first region, and a remaining region may be referred as a second region.

A method for adhering the masking block 300 to the first graphene thin film 130 may be same as the method for adhering the first catalyst block 200 to the passivation layer 120.

Figure 4D:
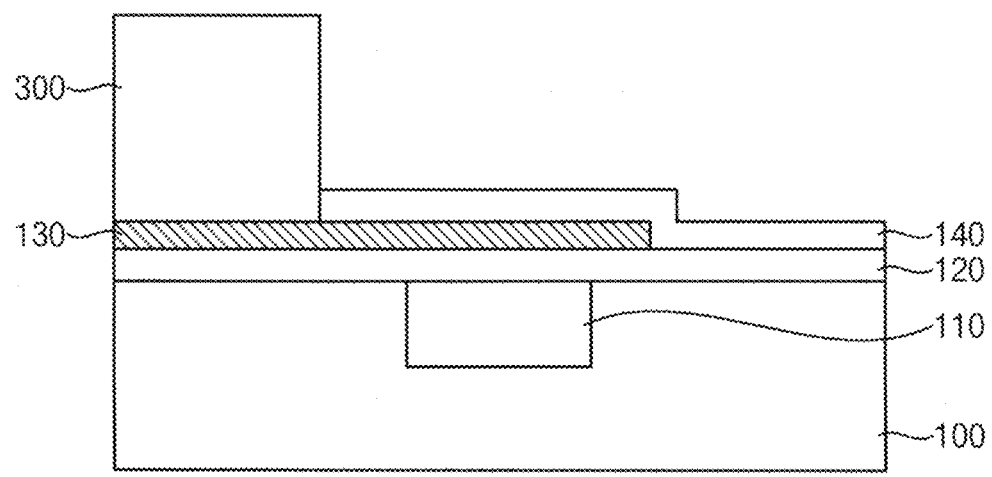

Referring to FIG. 4D, a dielectric layer 140 is formed in the second region that does not contact the masking block 300. In an exemplary embodiment, the dielectric layer 140 may include h-BN.

A source material for synthesizing h-BN such as borazine may not enter an interface between the masking block 300 and the first graphene thin film 130. Thus, the dielectric layer including h-BN may be formed in the second region.

For example, the dielectric layer 140 may cover an exposed upper surface of the first graphene thin film 130 and an exposed upper surface of the passivation layer 120. After the dielectric layer 140 is formed, the masking block 300 may be removed. Thus, an upper surface of the first graphene thin film 130 may be partially exposed.

Figure 4E:
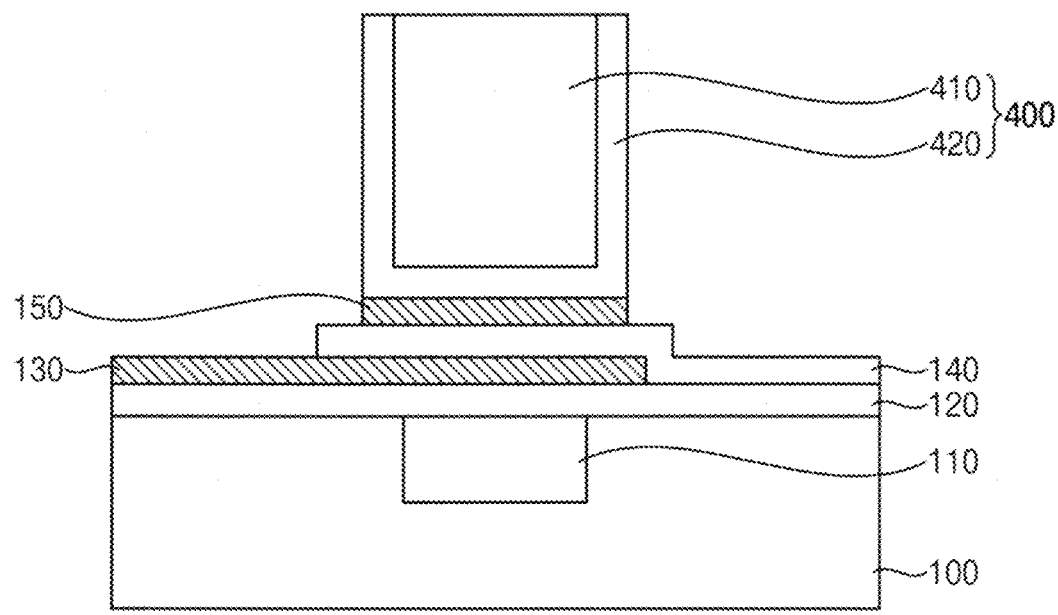

Referring to FIG. 4E, a second catalyst block 400 is physically adhered to an upper surface of the dielectric layer 140. The second catalyst block 400 may include a material having catalyst activity for a graphene precursor, for example, gamma-alumina. For example, the second catalyst block 400 may include a body 410 and a catalyst layer 420 covering at least a portion of a surface of the body 410.

Thereafter, a second graphene thin film 150 is synthesized at an interface between the dielectric layer 140 and the second catalyst block 400. The second graphene thin film 150 may overlap the first graphene thin film 130 and the waveguide 110.

Figure 4F:
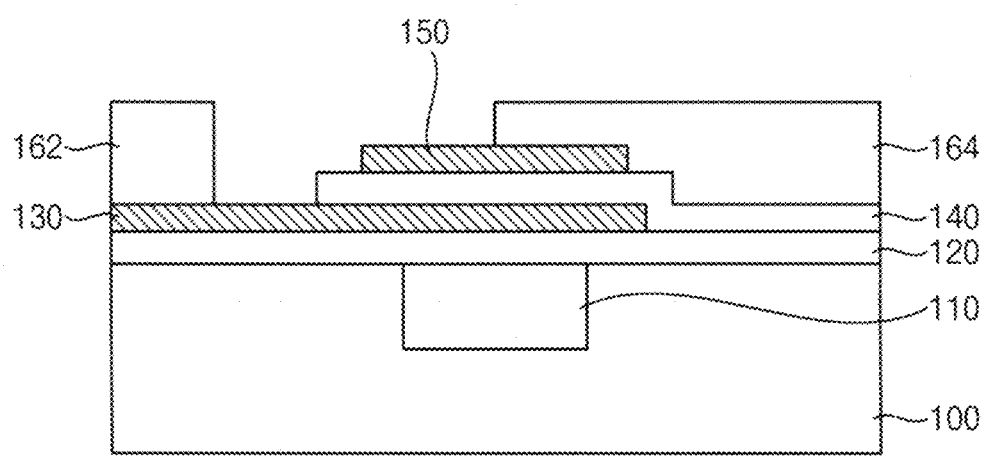

Referring to FIG. 4F, a first electrode 162 and a second electrode 164 are formed. The first electrode 162 is electrically connected to the first graphene thin film 130, and the second electrode 164 is electrically connected to the second graphene thin film 150. For example, the first electrode 162 may contact an upper surface of the first graphene thin film 130, and the second electrode 164 may contact an upper surface of the second graphene thin film 150.

For example, the first electrode 162 and the second electrode 164 may include a conductive material such as a metal, a metal oxide or the like.

A voltage may be applied to the first graphene thin film 130 and the second graphene thin film 150 through the first electrode 162 and the second electrode 164, respectively. Thus, an electric filed may be formed by a voltage difference between the first graphene thin film 130 and the second graphene thin film 150. As a result, a light progressing in the waveguide 110 may be modulated.

In an exemplary embodiment, an electro-optical modulator may be manufactured by direct synthesis of a graphene pattern. The graphene pattern may have inhibited defects. Thus, abilities of the electro-optical modulator may be improved.

Furthermore, the graphene pattern and a dielectric layer including h-BN may be formed as a pattern without an individual patterning process. Thus, efficiency and reliability of a process for manufacturing an electro-optical modulator may be improved.

Hereinafter, effects of exemplary embodiments will be explained with reference to particular examples and experiments Preparation of Catalyst Block An alumina ($Al_2O_3$) thin film was formed on a base substrate at 150° C. in an atomic layer deposition (ALD) reactor. The base substrate included $SiO_2$/Si having a thickness of 300 nm. Trimethylaluminum and deionized water were used for a precursor of an ALD process. A pressure was 1 torr, and pulse-maintaining time was 1 second with providing high-purity nitrogen gas (99.99%) for 60 seconds with 200 sccm in the ALD reactor. Under the above condition, 500 cycles were performed to form an amorphous alumina thin film having a thickness of 50 nm. Thereafter, a heat treatment was performed at 1,050° C. for 30 minutes with vacuum condition to form a catalyst block coated with gamma-alumina.

Adhesion of Growth Substrate and Catalyst Block 30 ml of sulfuric acid and 30 ml of hydrogen peroxide was mixed to react each other thereby preparing Piranha solution. The catalyst block was dipped in the Piranha solution, and a beaker containing the Piranha solution and the catalyst block was heated on a hot plate at 800° C. for 20 minutes. After the catalyst block was put out of Piranha solution, a surface of the catalyst block was cleaned by using deionized water and Mega sonicator. Thereafter, a surface of the catalyst block was dried by blowing nitrogen gas.

A quartz substrate was cleaned and dried by a same method as the above. The quartz substrate and the catalyst block were disposed so that the gamma-alumina layer of the catalyst block contacted the quartz substrate, and then pressed by a soft article such as Teflon tweezer.

Synthesis of Graphene Thin Film—Example 1

The quartz substrate combined with the catalyst block was disposed on a reaction furnace. The temperature of the reaction furnace was elevated to 1,050° C. under a condition with hydrogen gas flux of 1,000 sccm. Thereafter, 1,050° C. was maintained for 45 minutes with hydrogen gas flux of 100 sccm and methane gas flux of 1,000 sccm to synthesize a graphene thin film. Thereafter, the temperature of the reaction furnace was cooled to 600° C. with hydrogen gas flux of 100 sccm and methane gas flux of 1,000 sccm, and then cooled to a room temperature with hydrogen gas flux of 1,000 sccm. In the above process, oxygen gas due to air leakage was used for a growth inhibitor.

Synthesis of Graphene Thin Film—Comparative Example 1

The catalyst block was disposed on a quartz substrate without the adhesion process using Piranha solution, and a CVD process as Example 1 was performed to form a graphene thin film.

Figure 5:
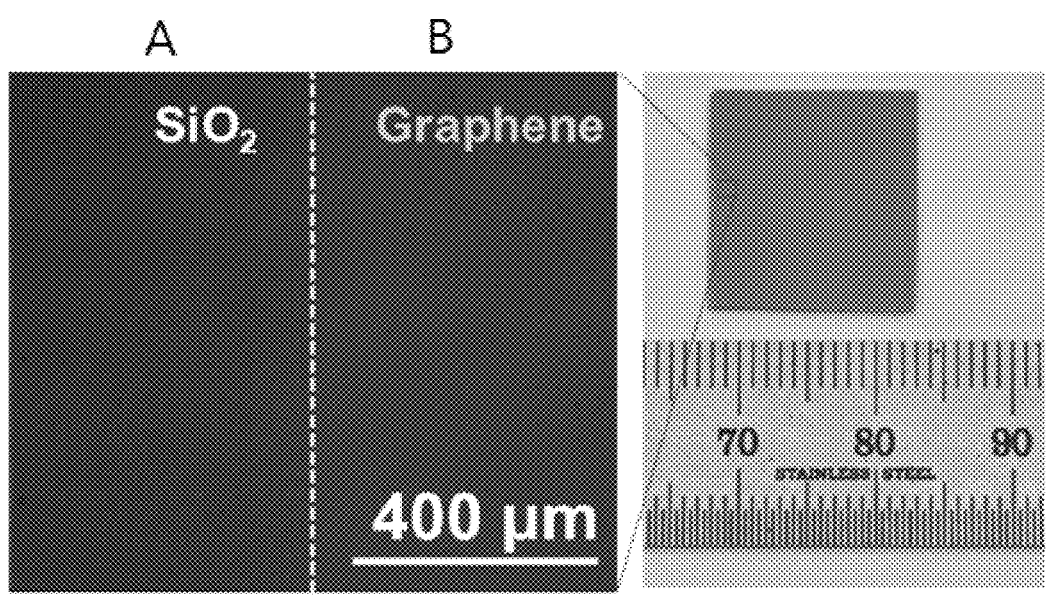
FIG. 5 is a picture showing the graphene thin film synthesized on the quartz substrate of Example 1.

FIG. 5 is a picture showing the graphene thin film synthesized on the quartz substrate of Example 1. Referring to FIG. 5, color difference between the region B where the catalyst block was combined with the quartz substrate and the region A uncovered by the catalyst block and exposed to a deposition gas can be perceived, and a boundary between the regions A and B was clear.

As a result of measuring conductivities of the regions A and B, the conductivity of the region B was about 4.8 kΩ while the conductivity of the region A was 0.

Thus, it can be noted that the graphene thin film was selectively synthesized in the region B where the catalyst block was combined with the quartz substrate.

Figure 6A:
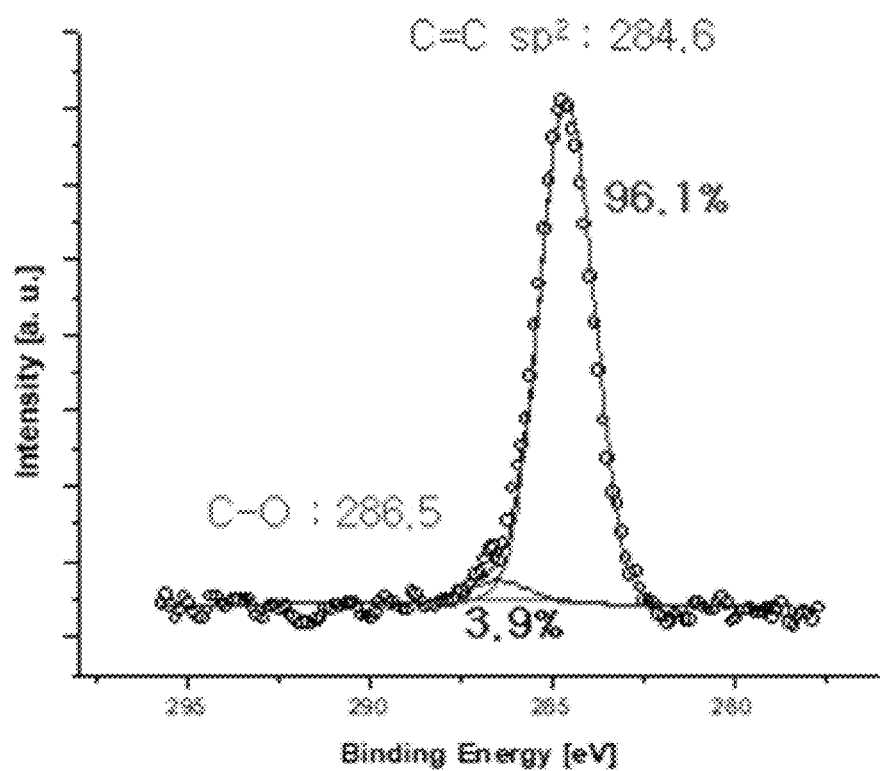
FIG. 6A is an XPS graph of the graphene thin film synthesized on the quartz substrate of Example 1.
Figure 6B:
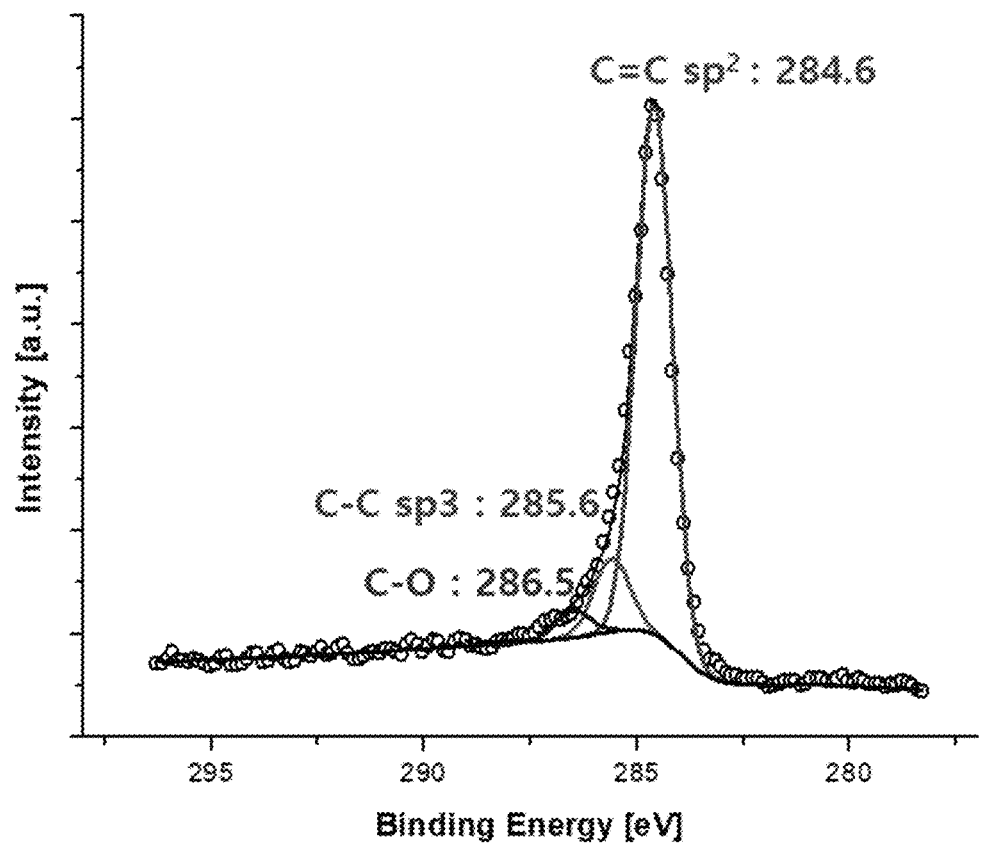
FIG. 6B is an XPS graph of the graphene thin film synthesized on the quartz substrate of Comparative Example 1.

FIG. 6A is an XPS graph of the graphene thin film synthesized on the quartz substrate of Example 1. FIG. 6B is an XPS graph of the graphene thin film synthesized on the quartz substrate of Comparative Example 1.

Referring to FIG. 6A, a ratio of sp2 bonds in the graphene thin film synthesized on the quartz substrate of Example 1 was about 96.1%, which mean very small defects. Furthermore, sp3 bonds, which may represent grain boundaries, were not measured. Thus, it can be noted that the graphene thin film has a high quality.

Referring to FIG. 6B, the graphene thin film synthesized on the quartz substrate of Comparative Example 1 had a low quality close to pristine graphite. Furthermore, a peak corresponding to sp3 bonds was high, which mean the graphene thin film had nano-grains. Thus, it can be noted that the graphene thin film synthesized on the quartz substrate of Example 1 has a high quality thereby functioning with intrinsic properties with compared to the graphene thin film synthesized on the quartz substrate of Comparative Example 1.

Exemplary embodiments of the present invention may be used for manufacturing various electronic elements including an electro-optical modulator, a switching element, a transistor, optical device or the like.

The foregoing is illustrative and is not to be construed as limiting thereof. Although a few exemplary embodiments have been described, those skilled in the art will readily appreciate that many modifications are possible in the exemplary embodiments without materially departing from the novel teachings, aspects, and advantages of the invention. Accordingly, all such modifications are intended to be included within the scope of this disclosure.

What is claimed is:

1. A method for synthesizing a graphene pattern, the method comprising:
   physically adhering a catalyst block including a catalyst material, which is a gamma-alumina thin film, to a portion of a growth substrate to form a flat interface between the catalyst block and the growth substrate;
   forming a graphene thin film selectively at the flat interface between the catalyst block and the growth substrate in an atmosphere including a carbon source and a growth inhibitor containing oxygen, and
   applying a force to physically separate the catalyst block from the graphene thin film and the growth substrate,
   wherein carbon atoms from the carbon source are diffused along the flat interface and the growth inhibitor is substantially blocked by a diffusion barrier formed by the flat interface so that the graphene thin film is selectively formed at the flat interface.

2. The method of claim 1, wherein physically adhering the catalyst block to the growth substrate includes:
   chemically cleaning the catalyst block, the growth substrate, or the catalyst block and the growth substrate using Piranha solution;
   physically cleaning the catalyst block, the growth substrate, or the catalyst block and the growth substrate using supersonic waves;
   drying the catalyst block, the growth substrate, or the catalyst block and the growth substrate to provide a dry catalyst block and a dry growth substrate; and
   bringing the dry catalyst block into contact with the dry growth substrate.

3. The method of claim 1, wherein a concentration of the growth inhibitor to the carbon source is equal to or more than $1/10^6$.

4. The method of claim 1, wherein the carbon source includes hydrocarbon gas, and the growth inhibitor includes oxygen gas.

5. The method of claim 1, wherein the growth substrate comprises a passivation layer which contacts the catalyst material and forms the flat interface between the catalyst material and the growth substrate.

6. The method of claim 5, wherein the passivation layer comprises hexagonal boron nitride (h-BN) or hexagonal boron nitride carbide (h-BNC).

7. A method for synthesizing a graphene pattern, the method comprising:
   providing a growth substrate and a catalyst block having a catalyst material disposed on at least a portion thereof;
   physically adhering the catalyst block to a portion of a growth substrate to form an interface between the catalyst material and the growth substrate; and
   forming a graphene thin film selectively at the interface between the catalyst material and the growth substrate in an atmosphere including a carbon source and a growth inhibitor,
   wherein the catalyst block includes a first body and a second body,
   wherein the first body has a shape that protrudes from the second body, and
   wherein the catalyst block is physically adhered to the growth substrate in a first region to form the interface, and spaced apart from the growth substrate in a second region, and spaced apart from the growth substrate by a distance in a third region that is smaller than that in the second region.

8. The method of claim 7, wherein the catalyst block and the growth substrate in the third region are separated by a distance of 5 nm to 1 mm.

9. The method of claim 7, wherein the graphene thin film is selectively synthesized in the first region and the third region, and wherein the graphene thin film has a higher conductivity in the first region than in the third region.

10. The method of claim 9, wherein the third region is disposed between adjacent first regions, and the graphene thin film in the third region forms a percolation channel connecting respective first regions to each other and having an effective channel width that is equal to or less than 5 nm.

11. The method of claim 7, wherein the second body includes a via portion that is connected to the second region.

12. The method of claim 7, wherein the growth substrate comprises a passivation layer which contacts the catalyst material and forms the interface between the catalyst material and the growth substrate.

13. The method of claim 12, wherein the passivation layer comprises hexagonal boron nitride (h-BN) or hexagonal boron nitride carbide (h-BNC).

* * * * *